(12) United States Patent
Emadi et al.

(10) Patent No.: US 10,439,118 B2
(45) Date of Patent: Oct. 8, 2019

(54) MEMS-BASED WAFER LEVEL PACKAGING FOR THERMO-ELECTRIC IR DETECTORS

(71) Applicant: Maxim Integrated Products, Inc., San Jose, CA (US)

(72) Inventors: Arvin Emadi, San Jose, CA (US); Nicole D. Kerness, Menlo Park, CA (US); Arkadii V. Samoilov, Saratoga, CA (US); Abhishek Sahasrabudhe, Sunnyvale, CA (US)

(73) Assignee: MAXIM INTEGRATED PRODUCTS, INC., Omaha, NE (US)

( * ) Notice: Subject to any disclaimer, the term of this patent is extended or adjusted under 35 U.S.C. 154(b) by 0 days.

(21) Appl. No.: 14/958,552

(22) Filed: Dec. 3, 2015

(65) Prior Publication Data

US 2016/0163942 A1 Jun. 9, 2016

Related U.S. Application Data

(60) Provisional application No. 62/087,459, filed on Dec. 4, 2014, provisional application No. 62/166,588, filed on May 26, 2015.

(51) Int. Cl.
G01J 5/12 (2006.01)
H01L 35/02 (2006.01)
(Continued)

(52) U.S. Cl.
CPC ............ *H01L 35/02* (2013.01); *G01J 5/024* (2013.01); *G01J 5/0225* (2013.01); *G01J 5/12* (2013.01);
(Continued)

(58) Field of Classification Search
CPC .. G01J 5/12; G01J 5/024; G01J 5/0225; G01J 5/045; G01J 5/0853; G01J 5/10;
(Continued)

(56) References Cited

U.S. PATENT DOCUMENTS 9,117,949 B2 * 8/2015 Mao .................. G01J 5/022
2003/0183921 A1 * 10/2003 Komobuchi .......... B81B 7/0077
257/704
(Continued)

FOREIGN PATENT DOCUMENTS

CN 2658728 Y 11/2004
CN 102583220 A 7/2012
(Continued)

OTHER PUBLICATIONS

Office Action in Chinese Application No. 201510885471, dated May 23, 2019.

*Primary Examiner* — Eric A. Ward
*Assistant Examiner* — Eric K Ashbahian
(74) *Attorney, Agent, or Firm* — Kevin E. West; Advent, LLP

(57) ABSTRACT

A device and techniques for fabricating the device are described for forming a wafer-level thermal sensor package using microelectromechanical system (MEMS) processes. In one or more implementations, a wafer level thermal sensor package includes a thermopile stack, which includes a substrate, a dielectric membrane, a first thermoelectric layer, a first interlayer dielectric, a second thermoelectric layer, a second interlayer dielectric, a metal connection assembly, a passivation layer, where the passivation layer includes at least one of a trench or a hole, and where the substrate includes a cavity adjacent to the at least one trench or hole, and a bond pad disposed on the passivation layer and electrically coupled to the metal connection assembly; and a cap wafer assembly coupled to the thermopile stack, the cap wafer assembly including a wafer having a cavity formed on a side of the wafer configured to be adjacent to the thermopile stack.

17 Claims, 8 Drawing Sheets

(51) Int. Cl.
*H01L 35/14* (2006.01)
*H01L 35/20* (2006.01)
*G01J 5/02* (2006.01)
*H01L 27/146* (2006.01)

(52) U.S. Cl.
CPC .............. *H01L 35/14* (2013.01); *H01L 35/20* (2013.01); *H01L 27/14649* (2013.01)

(58) Field of Classification Search
CPC ........... H01L 2924/1461; H01L 31/101; H01L 35/32; H01L 35/02; H01L 27/14649; H01L 27/14669; H01L 35/325; B81B 2203/0127; B81C 1/00047; G01K 7/028
See application file for complete search history.

(56) References Cited

U.S. PATENT DOCUMENTS

| | | | | |
|---|---|---|---|---|
| 2005/0145964 A1* | 7/2005 | Suzuki | .............. | H01L 31/02327 257/432 |
| 2008/0128620 A1* | 6/2008 | Krellner | ................... | G01J 5/041 250/338.1 |
| 2008/0164413 A1* | 7/2008 | Shibayama | ................ | G01J 5/04 250/338.4 |
| 2010/0213374 A1* | 8/2010 | Meinel | ...................... | G01J 5/12 250/338.4 |
| 2011/0174978 A1* | 7/2011 | Forg | .......................... | G01J 5/02 250/338.3 |
| 2012/0097853 A1* | 4/2012 | Ouvrier-Buffet | ......... | G01J 5/02 250/349 |
| 2012/0111387 A1* | 5/2012 | Cho | ........................ | H01L 35/32 136/225 |
| 2014/0061845 A1* | 3/2014 | Purkl | ...................... | H01L 31/09 257/467 |
| 2015/0136984 A1* | 5/2015 | Ishii | ........................ | G01J 5/023 250/338.4 |

FOREIGN PATENT DOCUMENTS

| CN | 102757011 A | 10/2012 |
|---|---|---|
| JP | h0888411 A | 4/1996 |

\* cited by examiner

MEMS-BASED WAFER LEVEL PACKAGING FOR THERMO-ELECTRIC IR DETECTORS

CROSS-REFERENCE TO RELATED APPLICATIONS

The present application claims the benefit under 35 U.S.C. § 119(e) of U.S. Provisional Application Ser. No. 62/087,459, filed Dec. 4, 2014, and titled "MEMS-BASED WAFER LEVEL PACKAGING FOR THERMO-ELECTRIC IR DETECTORS," and U.S. Provisional Application Ser. No. 62/166,588, filed May 26, 2015, and titled "MEMS-BASED WAFER LEVEL PACKAGING FOR THERMO-ELECTRIC IR DETECTORS." U.S. Provisional Application Ser. No. 62/087,459 and U.S. Provisional Application Ser. No. 62/166,588 are herein incorporated by reference in their entireties.

BACKGROUND

A thermopile sensor is an electronic device that converts thermal energy into electrical energy. These sensors may utilize several connected thermocouples to generate an output voltage proportional to a local temperature difference (e.g., a temperature gradient). These thermopile sensors may be utilized for many applications, such as in the medical industry to measure body temperature, in heat flux sensors, and/or gas burner safety controls.

SUMMARY

A device and techniques for fabricating the device are described for forming a wafer-level thermal sensor package using microelectromechanical system (MEMS) processes. In one or more implementations, a wafer level thermal sensor package includes a thermopile stack, which includes a substrate, a dielectric membrane formed on a first side of the substrate, a first thermoelectric layer formed on the dielectric membrane, a first interlayer dielectric formed on the first thermoelectric layer and the dielectric membrane, a second thermoelectric layer formed on the first interlayer dielectric, a second interlayer dielectric formed on the second thermoelectric layer and the first interlayer dielectric, a metal connection assembly electrically coupled to the first thermoelectric layer and the second thermoelectric layer, a passivation layer disposed on the metal connection assembly and the second interlayer dielectric, where the passivation layer includes at least one of a trench or a hole, and where the substrate includes a cavity adjacent to the at least one trench or hole; and a bond pad disposed on the passivation layer and electrically coupled to the metal connection assembly; and a cap wafer assembly coupled to the thermopile stack, the cap wafer assembly including a wafer having a cavity formed on a side of the wafer configured to be adjacent to the thermopile stack. An electronic device includes a wafer level thermal sensor coupled to the wafer level thermal sensor. In an implementation, a process for fabrication of the wafer level thermopile sensor includes forming a thermopile stack on a wafer level substrate and placing a cap wafer on the thermopile stack.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

Figure 1A:
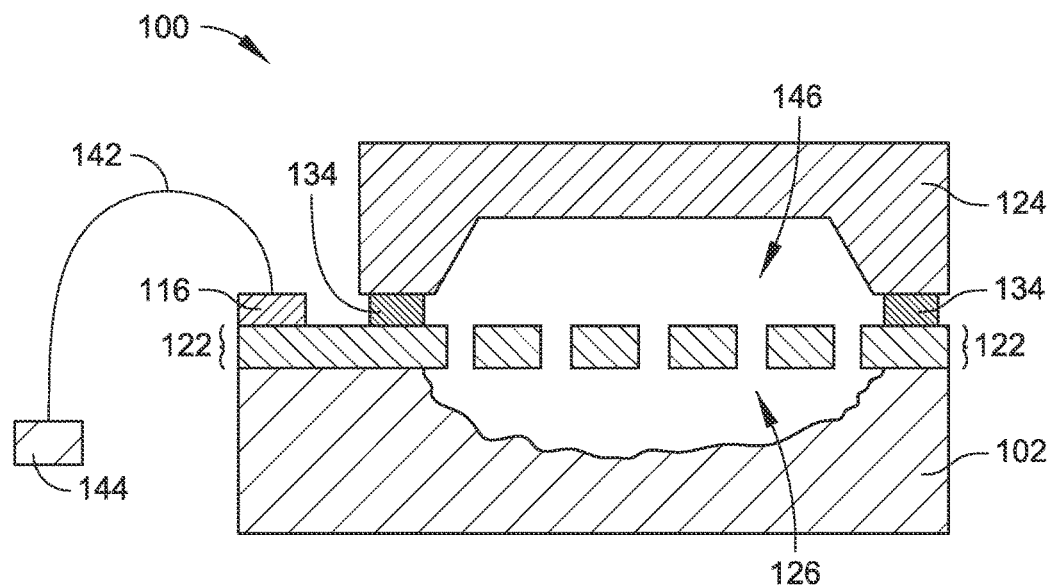
FIG. 1A is a diagrammatic partial cross-sectional side view illustrating a wafer level thermal sensor in a wire bond configuration, in accordance with an example implementation of the present disclosure.
Figure 1B:
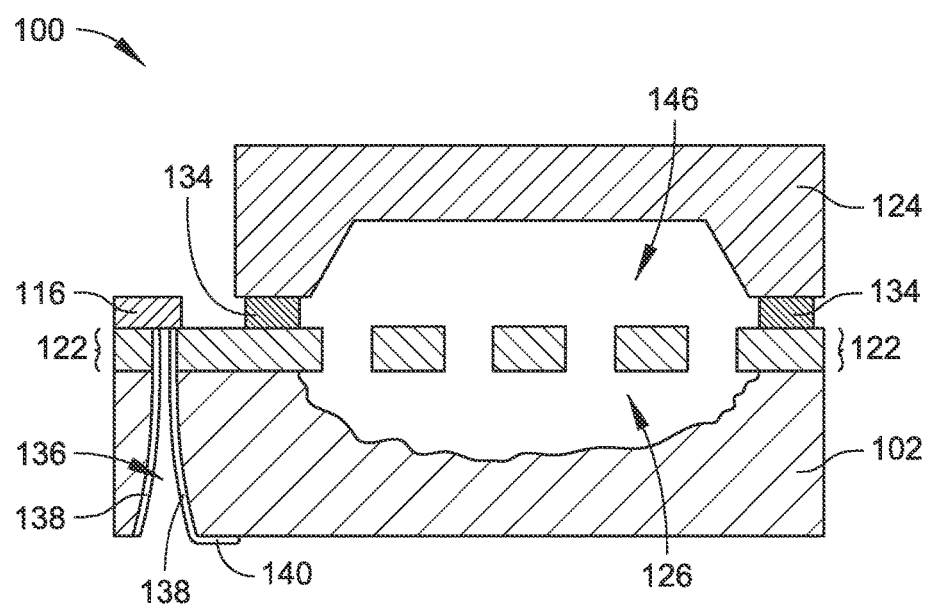
FIG. 1B is a diagrammatic partial cross-sectional side view illustrating a wafer level thermal sensor in a through-via configuration, in accordance with an example implementation of the present disclosure.
Figure 1C:
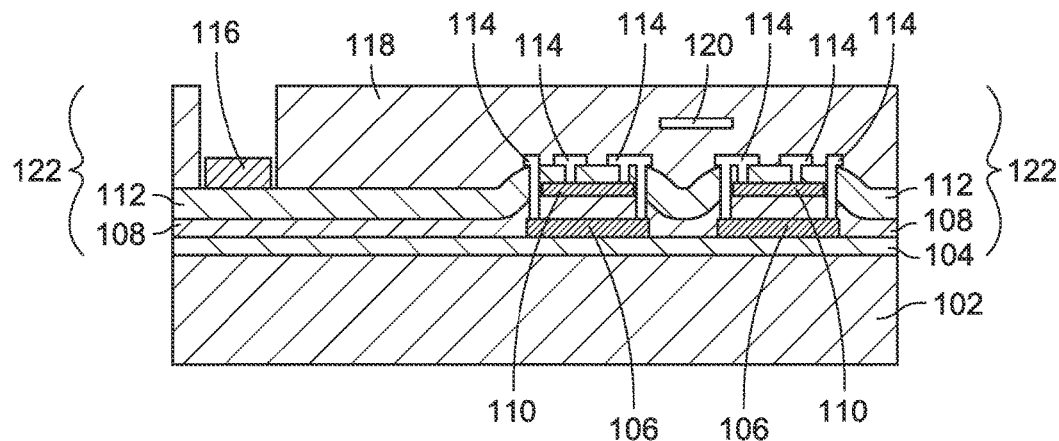
FIG. 1C is a diagrammatic partial cross-sectional side view illustrating a substrate and a thermopile stack configured for a wafer level thermal sensor, in accordance with an example implementation of the present disclosure.
Figure 1D:
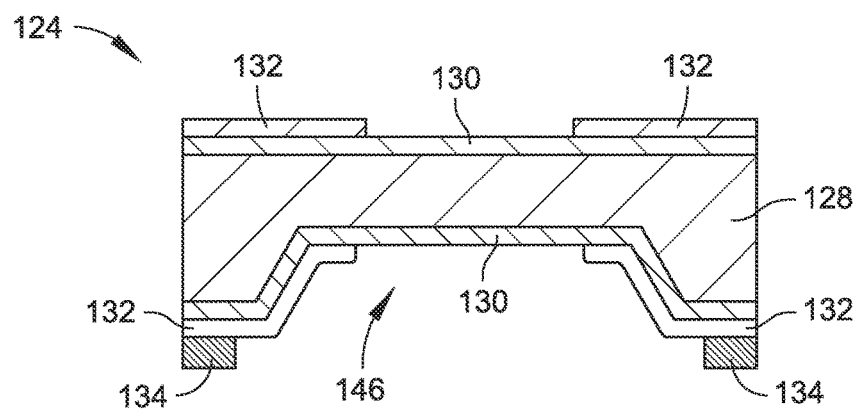
FIG. 1D is a diagrammatic partial cross-sectional side view illustrating a cap wafer assembly configured for a wafer level thermal sensor, in accordance with an example implementation of the present disclosure.
Figure 1E:
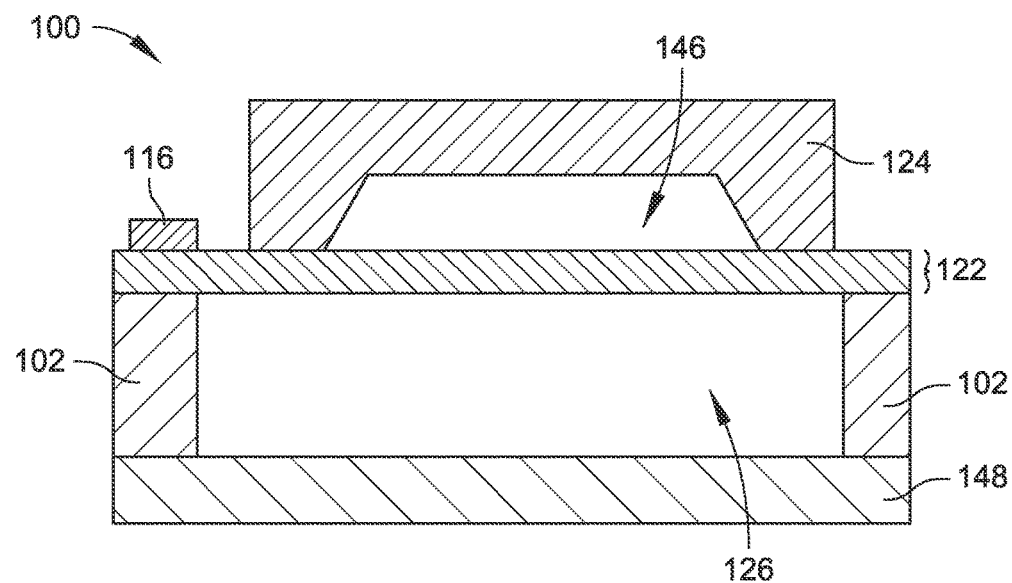
FIG. 1E is a diagrammatic partial cross-sectional side view illustrating a cap wafer assembly configured for a wafer level thermal sensor, in accordance with an example implementation of the present disclosure.
Figure 1F:
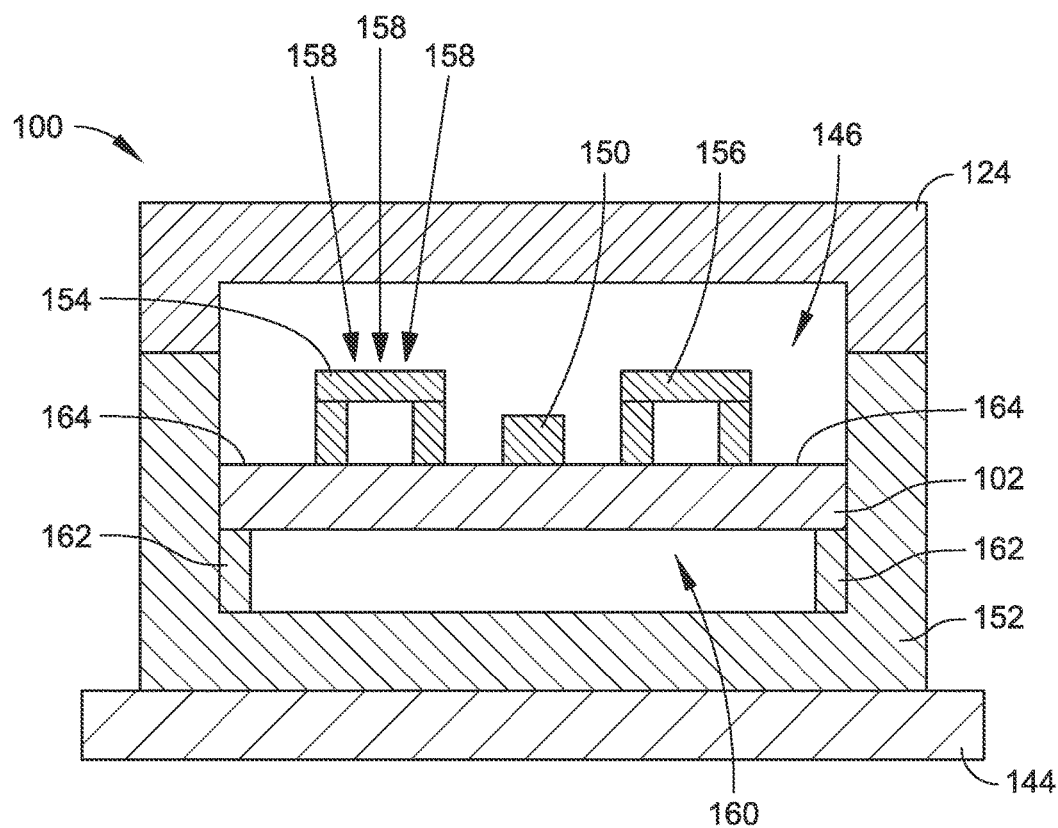
Figure 2:
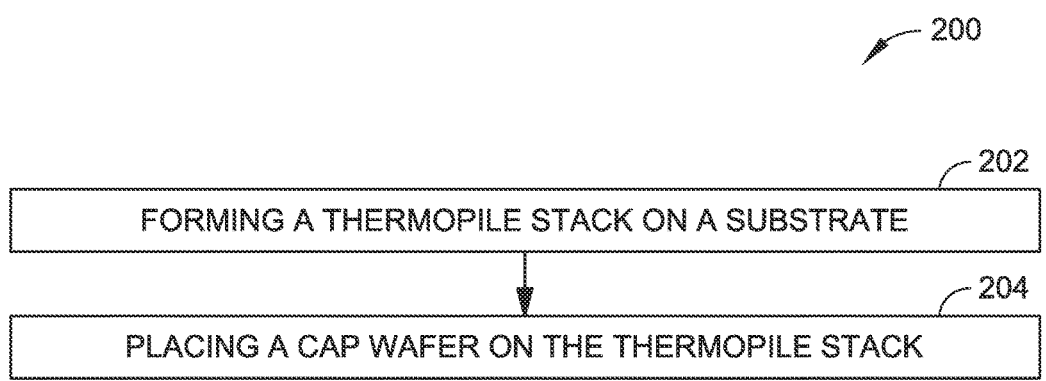

FIG. 1F is a diagrammatic partial cross-sectional side view illustrating a wafer level thermal sensor having a cavity between a substrate and a base for minimizing thermal gradients, in accordance with an example implementation of the present disclosure FIG. 2 is a flow diagram illustrating a process in an example implementation for fabricating a wafer level thermal sensor, such as the wafer level thermal sensor shown in FIGS. 1A through 1F.

Figure 3A:
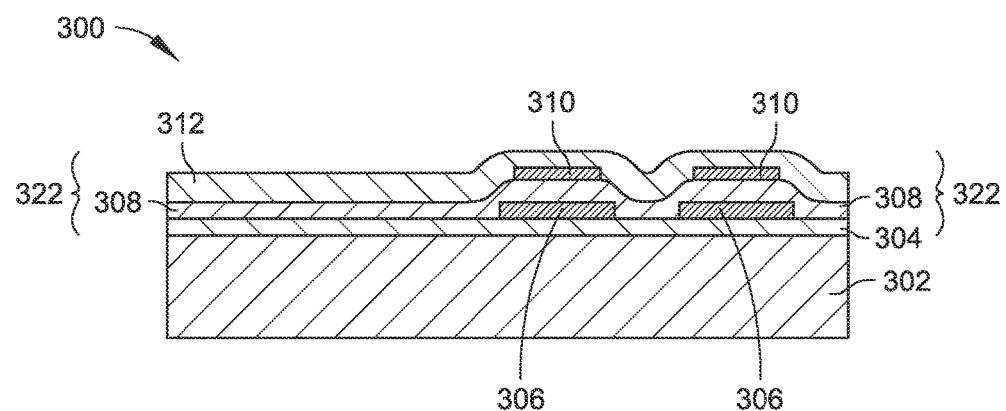

FIG. 3A is a diagrammatic partial cross-sectional side elevation view illustrating the fabrication of a wafer level thermal sensor, such as the wafer level thermal sensor shown in FIGS. 1A through 1F, in accordance with the process shown in FIG. 2.

Figure 3B:
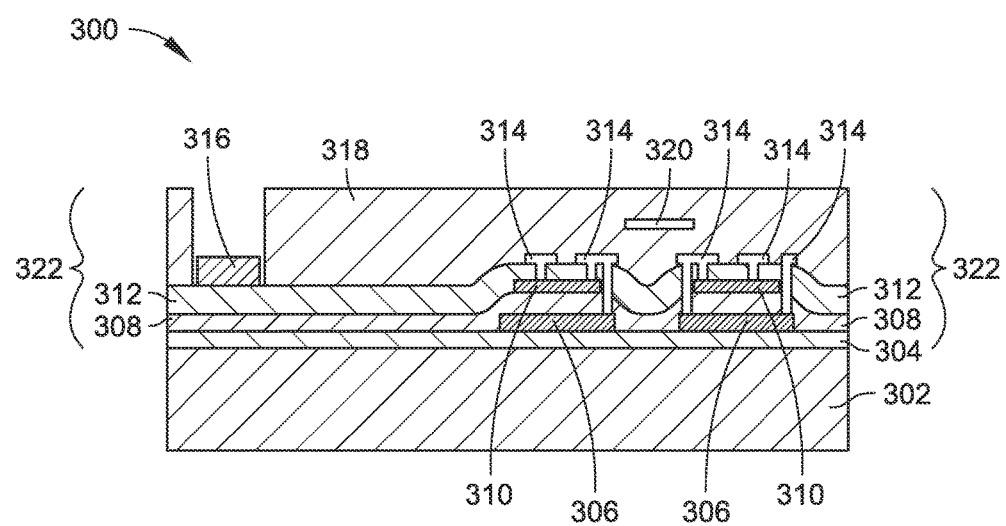

FIG. 3B is a diagrammatic partial cross-sectional side elevation view illustrating the fabrication of a wafer level thermal sensor, such as the wafer level thermal sensor shown in FIGS. 1A through 1F, in accordance with the process shown in FIG. 2.

Figure 3C:
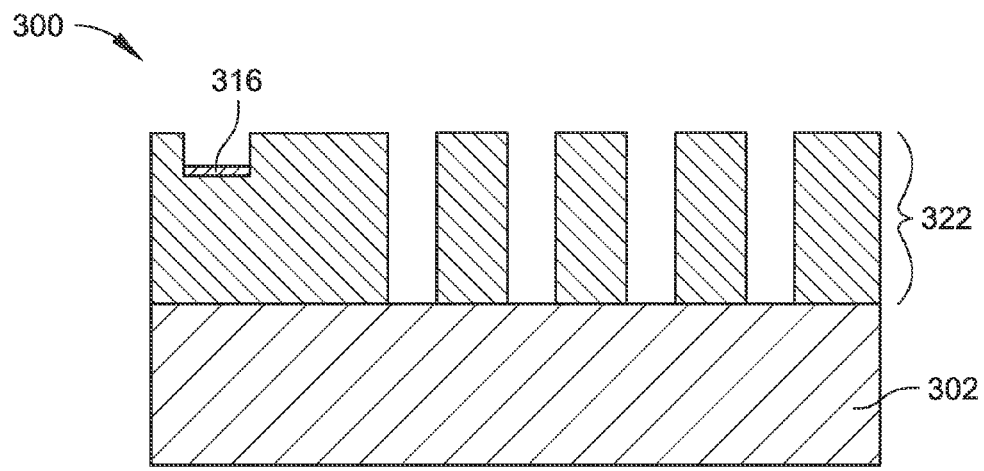

FIG. 3C is a diagrammatic partial cross-sectional side elevation view illustrating the fabrication of a wafer level thermal sensor, such as the wafer level thermal sensor shown in FIGS. 1A through 1F, in accordance with the process shown in FIG. 2.

Figure 3D:
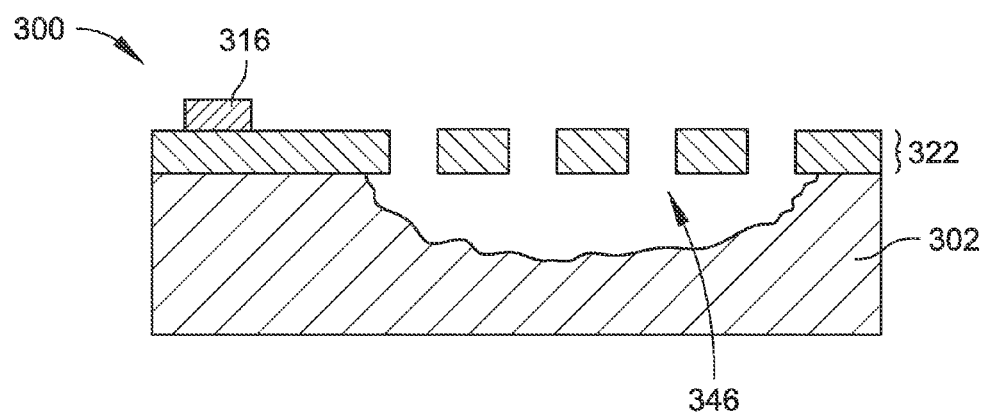

FIG. 3D is a diagrammatic partial cross-sectional side elevation view illustrating the fabrication of a wafer level thermal sensor, such as the wafer level thermal sensor shown in FIGS. 1A through 1F, in accordance with the process shown in FIG. 2.

Figure 3E:
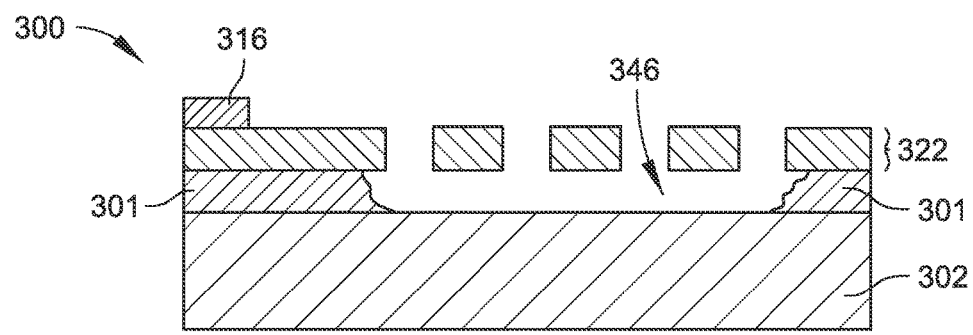

FIG. 3E is a diagrammatic partial cross-sectional side elevation view illustrating the fabrication of a wafer level thermal sensor, such as the wafer level thermal sensor shown in FIGS. 1A through 1F, in accordance with the process shown in FIG. 2.

Figure 3F:
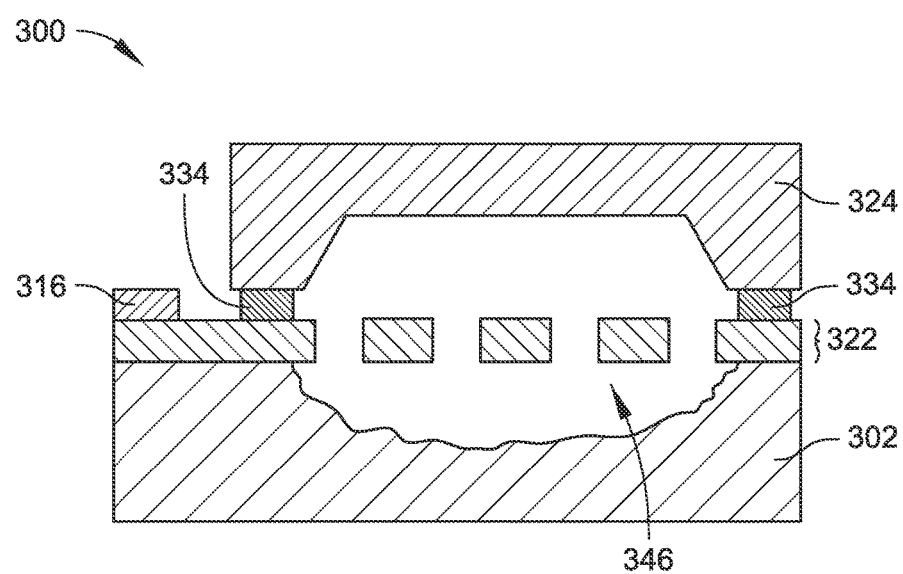

FIG. 3F is a diagrammatic partial cross-sectional side elevation view illustrating the fabrication of a wafer level thermal sensor, such as the wafer level thermal sensor shown in FIGS. 1A through 1F, in accordance with the process shown in FIG. 2.

Figure 3G:
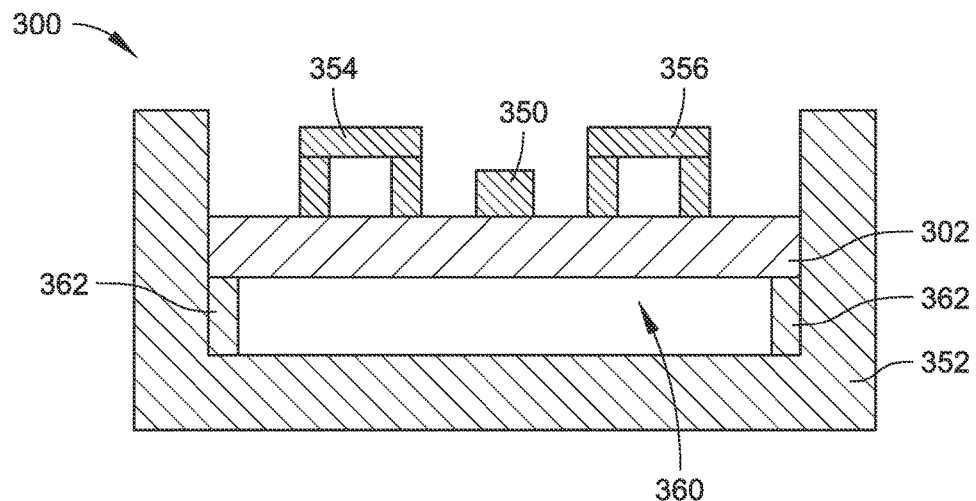

FIG. 3G is a diagrammatic partial cross-sectional side elevation view illustrating the fabrication of a wafer level thermal sensor, such as the wafer level thermal sensor shown in FIGS. 1A through 1F, in accordance with the process shown in FIG. 2.

Figure 3H:
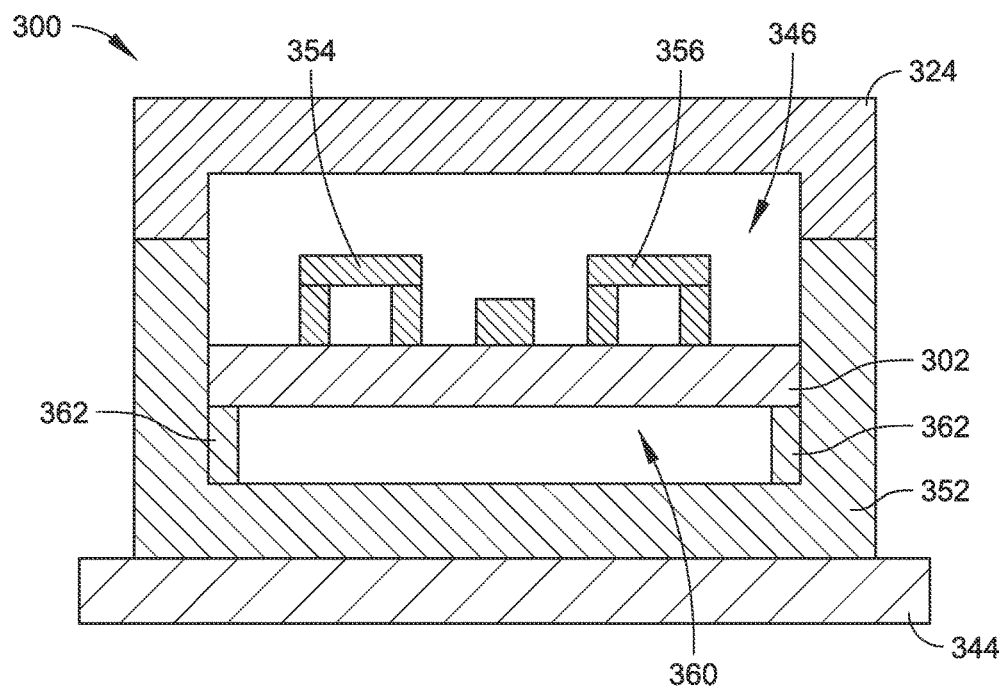

FIG. 3H is a diagrammatic partial cross-sectional side elevation view illustrating the fabrication of a wafer level thermal sensor, such as the wafer level thermal sensor shown in FIGS. 1A through 1F, in accordance with the process shown in FIG. 2.

DETAILED DESCRIPTION

Overview

A thermopile translates received infrared (IR) radiation into a voltage. This conversion is implemented by the use of thermoelectric materials in the thermopile sensor. In the thermopile sensor, radiation heats a membrane that is normally enhanced by the use of proper IR absorbing layers. The absorbed IR radiation produces a heat—the amount of heat generated depends on the thermal conductivity of the membrane. The lower the thermal conductivity of the membrane, the more heat is generated. Therefore, in the design of a high sensitivity sensor, it is important to reduce the thermal conductivity of the IR absorbing membrane region. Reducing the thermal conductivity can be implemented by assuring that the silicon or substrate is removed in the membrane region and assuring that gas proximate to the membrane has low and controlled thermal conductivity.

As the sensitivity and response of the thermopile sensor greatly depends on the control of thermal conductivity of the membrane, control of the thermal conductivity of the membrane as much as possible is desired. Therefore, thermopile sensors are usually hermetically sealed. However, hermetically sealed packages are expensive and fabricating them in large volumes can be difficult.

Accordingly, a device and techniques for fabricating the device are described to form a wafer-level thermal sensor package using microelectromechanical system (MEMS) processes. In one or more implementations, a wafer level thermal sensor package includes a thermopile stack, which includes a substrate, a dielectric membrane formed on a first side of the substrate, a first thermoelectric layer formed on the dielectric membrane, a first interlayer dielectric formed on the first thermoelectric layer and the dielectric membrane, a second thermoelectric layer formed on the first interlayer dielectric, a second interlayer dielectric formed on the second thermoelectric layer and the first interlayer dielectric, a metal connection assembly electrically coupled to the first thermoelectric layer and the second thermoelectric layer, a passivation layer disposed on the metal connection assembly and the second interlayer dielectric, where the passivation layer includes at least one of a trench or a hole, and where the substrate includes a cavity adjacent to the at least one trench or hole; and a bond pad disposed on the passivation layer and electrically coupled to the metal connection assembly; and a cap wafer assembly coupled to the thermopile stack, the cap wafer assembly including a wafer having a cavity formed on a side of the wafer configured to be adjacent to the thermopile stack. An electronic device includes a wafer level thermal sensor coupled to the wafer level thermal sensor. In an implementation, a process for fabrication of the wafer level thermopile sensor includes forming a thermopile stack on a wafer level substrate and placing a cap wafer on the thermopile stack.

In an implementation, the wafer level thermal sensor package includes a base including a stepped structure; a substrate disposed on the stepped structure, where the base, the stepped structure, and the substrate define a first cavity that reduces a thermal gradient; a first thermopile disposed on the substrate; a second thermopile disposed on the substrate; a resistance temperature detector disposed on the substrate; and a cap wafer assembly coupled to the base, where the cap wafer assembly, the base, and the substrate define a second cavity that houses the first thermopile, the second thermopile, and the resistance temperature detector.

One problem that the wafer level thermopile sensor disclosed herein solves is that the gas proximate to and in contact with the thermopile can be completely controlled because there is a cap wafer on the thermopile sensor that is hermetically sealed at wafer level in a vacuum. This is a standard MEMS process having a much lower cost than making an individual hermetic package for each sensor.

Additionally, due to the fragile dielectric membranes in a thermopile sensor, mechanical and sometimes even laser dicing on the wafers of thermopiles is challenging an d costly. By putting a capping layer on the top of the fragile membranes, these free standing structures are protected from mechanical shock during dicing (e.g., for example from water jets, particles produced in the process, etc.).

Furthermore, when the wafer level thermopile sensor is used standalone and not repackaged with other elements in another package, the optics of the wafer level thermopile sensor will all be at the same or similar temperature, and package effects known to thermopile sensors are reduced and may become negligible.

In the following discussion, an example semiconductor device is first described. Exemplary procedures are then described that may be employed to fabricate the example semiconductor device.

Example Implementations

FIGS. 1A and 1B illustrate a cross-sectional view of a wafer level thermal sensor package 100 in accordance with an example implementation of the present disclosure. FIGS. 1C and 1D illustrate a thermopile stack 122 and a cap wafer assembly 124, respectively, which when coupled, form an exemplary wafer level thermopile sensor, such as the wafer level thermopile sensor 100 as illustrated in FIGS. 1A and 1B. As shown in FIG. 1C, the thermopile stack 122 can include a dielectric membrane 104, a first thermoelectric layer 106, a second thermoelectric layer 110, a first interlayer dielectric 108, a second interlayer dielectric 112, a metal connection assembly 114, and/or a passivation layer 118.

As shown in FIGS. 1A through 1C, the wafer level thermal sensor package 100 includes a substrate 102. In implementations, a substrate 102 can include a silicon wafer, such as a semiconductor wafer, a carrier wafer, and/or an integrated circuit chip. In one specific implementation, the substrate 102 includes a silicon carrier wafer that has not been singulated. In some examples, a substrate 102 may include integrated circuits formed therein. Additionally, the substrate 102 may include electrical interconnections formed therein (e.g., integrated circuits, redistribution layers, vias, contact pads, metal routing, etc.). In implementations, a cavity 126 can in subsequent steps be etched into a portion of the substrate adjacent to a dielectric membrane 104. In other implementations, the substrate 102 can include a cavity 126 defined by a second cap wafer 148. In this embodiment, as illustrated in FIG. 1E, the substrate 102 can be etched on the backside (e.g., side distal from the thermopile stack 122) to form a cavity 126, and a second cap wafer 148 can be placed on the backside of the substrate 102.

The wafer level thermal sensor package 100 includes a dielectric membrane 104 formed on the substrate 102, as illustrated in FIGS. 1A through 1C. A dielectric membrane 104 can function to extend from the substrate 102 and cover a cavity 126 etched into the substrate 102. In some embodiments, the dielectric membrane 104 can include silicon dioxide (SiO$_2$). It is contemplated that other materials can be used for the dielectric membrane 104. In some implementations, the dielectric membrane 104 may include one or more materials and/or layers. In one example, the dielectric membrane 104 may include a silicon dioxide layer, a silicon nitride layer, and a silicon dioxide layer. The dielectric membrane 104 further provides thermal conductance between a hot junction (e.g., absorption stack 120 described herein) and a cold junction (e.g., bulk of the substrate 102), which may result in a higher temperature difference between the absorption stack 120 and the bulk of the substrate 102 when heat is absorbed through electromagnetic radiation (e.g., light) incident upon the wafer level thermopile sensor 100.

As illustrated in FIGS. 1A through 1C, a first thermoelectric layer 106 formed over at least a portion of the dielectric membrane 104, a first interlayer dielectric 108 formed on the first thermoelectric layer 106 and the dielectric membrane 104, a second thermoelectric layer 110 formed on at least a portion of the first interlayer dielectric 108, and a second interlayer dielectric 112 formed on the second thermoelectric layer 110 and the first interlayer dielectric 108. In one embodiment and as illustrated in FIG. 1C, the first thermoelectric layer 106 and/or the second thermoelectric layer 110 can be configured to be discontinuous or can be formed in separate locations on the dielectric membrane 104 and/or the substrate 102. The first thermoelectric layer 106 and the second thermoelectric layer 110, when electrically coupled, form thermocouples for the thermopile device of the wafer level thermal sensor package 100. In implementations, the first thermoelectric layer 106 and/or the second thermoelectric layer 110 can include materials such as N-dope poly silicon, P-dope poly silicon, metals such as aluminum or gold, and/or alloyed semiconductors such as BiTe, BiSb, etc. In implementations, the first interlayer dielectric 108 and/or the second interlayer dielectric 112 can include materials such as silicon dioxide (SiO$_2$), a silicate (e.g., tetraethyl-orthosilicate (TEOS)), phosphosilicate glass (PSG), borophosphosilicate glass (BPSG), or a combination.

A metal connection assembly 114 is then formed on and/or in the substrate 102 and/or the thermopile stack 122. In implementations, the metal connection assembly 114 can include a contact pad, a through-via, a redistribution layer, metal lines, etc., and can electrically connect the first thermoelectric layer 106, the second thermoelectric layer 110, and/or a bond pad 116. The bond pad 116 can function to provide an electrical connection from the wafer level thermopile sensor 100 to an external device (e.g., printed circuit board 144). In an implementation, the metal connection assembly 114 can include a suitable conductive material for providing electrical interconnectivity characteristics. For example, the metal connection assembly 114 and/or the bond pad 116 can include aluminum, or other suitable materials. In a specific embodiment, multiple sets of an element in the first thermoelectric layer 106 is electrically coupled to an element in the second thermoelectric layer 110 by the metal connection assembly 114, which each form a thermocouple. These thermocouples, when electrically coupled in series, form a thermopile sensor. The thermopile sensor (e.g., thermopile stack 122) is configured to convert thermal energy into electrical energy. In one implementation, the thermopile sensor can generate an output voltage based upon long wavelength infra-red (LWIR) emissions.

As shown in FIGS. 1A through 1C, a passivation layer 118 is formed over the second interlayer dielectric 112 and functions as a final passivation layer for the thermopile stack 122. The passivation layer 118 can include materials, such as SiO2, PSG, TEOS, BPSG, silicon nitride (SiN), etc. In one implementation, the passivation layer 118 includes a phosphosilicate glass (PSG) material that serves to insulate the various layers of the thermopile stack 122. In the implementations shown in FIGS. 1A and 1B, the passivation layer 118 includes at least one trench and/or hole formed in the passivation layer 118 that extends from a cavity 126 formed in the substrate 102 to the surface of the passivation layer 118 (e.g., side distal from the substrate 102).

Additionally, the passivation layer 118 can include patterned metal layers (e.g., titanium, aluminum, copper, etc.), which can form an absorption stack 120. In some implementations, these patterned metal layers can function to absorb more infrared energy and generate additional heat. The absorption stack 120 can include multiple materials (e.g., layers of materials) and can provide absorption and/or reflective functionality to the wafer level thermopile sensor 100. In one implementation, the absorption stack 120 includes a first layer, a second layer (e.g., n-type poly-silicon, amorphous silicon, germanium, or the like), and a third layer (e.g., titanium). In various implementations, the first layer can include a material that provides reflective characteristics. For example, the first layer may include an aluminum material having a thickness ranging from about twenty nanometers to about one hundred nanometers. In various implementations, the second layer can include a long wavelength infra-red (LWIR) material that provides wave phase shift (e.g., quarter wave phase shift) characteristics. For example, the second layer may include an n-type poly-silicon material, an amorphous silicon material, or a germanium, and the second layer may have a thickness ranging from about five hundred nanometers to about seven hundred and fifty nanometers. In various implementations, the third layer includes a material that provides absorption and/or reflective characteristics. For example, the third layer may include a titanium material having a thickness ranging from about two nanometers to about five nanometers. It is contemplated that the absorption stack 120 can include other additional layers.

In an implementation, illustrated in FIG. 1A, the substrate 102 and/or the thermopile stack 122 may include a via 136, via metal 138, and/or redistribution layer 140. In these implementations, the via 136, via metal 138, and/or the redistribution layer 140 can serve as an electrical connection from the bond pad 116 and thermopile stack 122 to an external device (e.g., printed circuit board 144). In an implementation, shown in FIG. 1B, the bond pad 116 and the thermopile stack 122 can be coupled to an external device or printed circuit board 144 using a wire bond 142 configuration.

As shown in FIGS. 1A through 1B and 1D, the wafer level thermal sensor package 100 includes a cap wafer assembly 124 configured to be coupled to the substrate 102 and thermopile stack 122. In implementations, the cap wafer assembly 124 includes a wafer 128. In embodiments, the wafer 128 can include a silicon wafer in which a cavity 146 is formed. The cavity 146 further defines an aperture in which IR energy enters the wafer level thermal sensor package 100. In other embodiments, the wafer 128 can include a silicon wafer with no cavity 146. Additionally, the cap wafer assembly 124 can include at least one metal bonding pad disposed on the wafer 128, where the metal bonding pad may be configured to couple the cap wafer assembly 124 to the thermopile stack 122.

The cap wafer assembly 124 and the wafer 128 may further include at least one optical filter 130, a lens, and/or at least one metal layer 132. An optical filter 130 can be disposed on one or both surfaces of the wafer 128 (e.g., the sides configured to be nearest to and distal from the thermopile stack 122). The optical filter 130 can function to enhance light and/or energy passing through the wafer 128 and cap wafer assembly 124 by serving as an antireflection coating, for example. Additionally, the optical filter 130 can serve to select the light/energy wavelength that can pass through the cap wafer assembly 124 and reach the thermopile stack 122. Some materials that can be used for the optical filter 130 can include germanium (Ge), silicon (Si), zinc sulfide (ZnS), zinc selenide (ZnSe), yttrium fluoride (YF) etc. In some embodiments, the optical filter 130 may include a carbon-based top layer (e.g., a diamond-like carbon (DLC)) disposed on the surface configured to be exposed to the environment in order to be scratch resistant. Some other materials, such as a thin oxide (e.g., SiO2, Y2O3, etc.) can also be utilized as a carbon-based top layer. In some embodiments, the cap wafer assembly can include a lens configured to function as a transmissive optical device that can affect passing light through refraction. In one specific embodiment, the cap wafer assembly 124 includes a lens disposed over the thermopile stack 122. It is contemplated that the lens can be located in the cap wafer assembly 124 as determined by a person of skill in the art.

The cap wafer assembly 124 and the wafer 128 may further include at least one metal layer 132 disposed on at least a portion of at least one surface of the wafer 128 (e.g., the sides configured to be nearest to and distal from the thermopile stack 122). In implementations, a metal layer 132 can be disposed before or after an optical filter 130. For example, a metal layer 132 can be formed and/or applied to a surface of the wafer 128 with an optical filter 130 disposed on the metal layer 132. In another example, a metal layer 132 can be disposed on an optical filter 130, which is disposed on a surface of the wafer 128. In yet another example, a metal layer 132 may be disposed on only a portion of the surface of the wafer 128. Some examples of metals that can be implemented as the metal layer 132 can include aluminum, gold, nickel, tantalum, titanium, etc., or a combination of these metals. It is contemplated that other metals and/or alloys may be used for the metal layer 132. A metal layer 132 can function to define and fix the field-of-view (FOV) of the wafer level thermal sensor package 100 and the angle of the light that can reach the thermopile sensor.

In some implementations, a metal stack 134 may be disposed on the wafer 128 and the cap wafer assembly 124. In these implementations, at least one metal stack 134 can be placed on the wafer 128 configured to couple the cap wafer assembly 124 with the passivation layer 118 and the thermopile stack 122. In one embodiment, the metal stack 134 can include metals such as gold, nickel, tantalum, platinum, or a combination. It is contemplated that other metals can also be utilized in the metal stack 134. In other implementations, the cap wafer assembly 124 can be coupled to the substrate 102 and the thermopile stack 122 using a glass frit bond. A glass frit bond can include a glass bond where the bond material is soldered. A glass frit bond can be used on differing surfaces, such as the passivation layer 118, the substrate 102 (e.g., a silicon surface), and/or a metal surface, such as aluminum or titanium, as well as other glass materials. In one specific example, the cap wafer assembly 124 is coupled to the passivation layer 118 using a glass frit bond.

As shown in FIGS. 1A and 1B, the cap wafer assembly 124 can be coupled to the thermopile stack 122 and substrate 102 in a vacuum to form a wafer level thermal sensor package 100 with a hermetically seal. The vacuum inside the wafer level thermal sensor package 100 can increase the sensitivity of the wafer level thermal sensor package 100 compared to embodiments when a thermal sensor is packaged in a nitrogen environment, such as low-cost TO can packaged thermopile sensors.

In one specific implementation, a wafer level thermal sensor package 100 can include a tandem sensor configuration where a first wafer level thermal sensor package 100 is disposed adjacent to a second wafer level thermal sensor package 100. In this implementation, the first wafer level thermal sensor package 100 can include a cap wafer assembly 124 with an aperture defined by a cavity 146 and a metal layer 132 formed over a portion of the surface of the wafer 128. The second wafer level thermal sensor package 100 may include a cap wafer assembly 124 that is completely covered by a metal layer 132.

For proper functioning of the wafer level thermal sensor package 100, the temperature gradient between the cold junctions of the first thermopile 154 and the second thermopile 156 and the resistance temperature detector 150 should be minimized. The resistance temperature detector 150 temperature should be as close as possible to the cold junction temperature of the first thermopile 154 and the second thermopile 156. In previous thermopile package designs, printed circuit board lateral thermal gradients (due to different heat sources on the printed circuit board) are often directly transferred through its ceramic package base to a thermopile and the resistance temperature detector when the package is placed directly on a printed circuit board. Since the resistance temperature detector does not track the cold junctions of the two thermopiles accurately, there is often an error in measurement.

In a specific embodiment illustrated in FIG. 1F, a wafer level thermal sensor package 100 can include a cavity 160 disposed between substrate 102 and a base 152. The cavity 160 may extend the whole length between the substrate 102 and the base 152 or may extend only partially the length between the substrate 102 and the base 152. The cavity 160 may include a vacuum or may include a low conductivity gas (e.g., air, nitrogen, etc.). In some implementations, base 152 can include ceramic. It is contemplated that base 152 can include other materials. Base 152 may be coupled with a printed circuit board 144 or other component, for example using an adhesive and/or solder connections. In this embodiment, the wafer level thermal sensor package 100 may include a substrate 102 with a first thermopile 154, a second thermopile 156, and/or a resistance temperature detector (RTD) 150. In specific embodiments, the substrate 102 can include a silicon substrate, which can act as a good conductor and minimize thermal gradients. In other specific embodiments, substrate 102 can include ceramic and/or other materials and may include a metal layer 164 on at least one side. For example, substrate 102 may include a 100-200 µm fold conducting layer on a top side of the substrate 102 (e.g., side with first thermopile 154). In another specific example, substrate 102 can include a metal layer 164 on the bottom (e.g., side proximate to cavity 160) of substrate 102. In the embodiment shown in FIG. 1F, the wafer level thermal sensor package 100 can include multiple thermopiles (e.g., first thermopile 154 and second thermopile 156)

and an integrated resistance temperature detector 150. However, the wafer level thermal sensor package 100 may include only one thermopile, additional thermopiles, or may not include a resistance temperature detector. A resistance temperature detector 150 can include a sensor used to measure a temperature by correlating the resistance of the resistance temperature detector 150 with varying temperature. In a specific embodiment, the resistance temperature detector 150 can be configured to provide a temperature for calibration of the wafer level thermal sensor package 100.

Continuing with the embodiment illustrated in FIG. 1F, the substrate 102 with a first thermopile 154, a second thermopile 156, and/or a resistance temperature detector 150 can be disposed within and/or housed by a base 152. As shown in FIG. 1F, the base 152 can include a bottom portion configured to be coupled to an external component, such as a printed circuit board 144. The base can include at least one support 162 configured to mechanically and/or electrically support the substrate 102 such that there is a cavity 160 disposed between the base 152 and the substrate 102. In implementations, the base 152 can include a stepped structure 162 for mechanically and/or electrically supporting the substrate 102 and/or partially defining cavity 160. The stepped structure 162 can be integral with base 152 and/or can be a separate component from base 152. The cavity 160 can isolate at least one cold junction within the first thermopile 154, the second thermopile 156, and/or other thermopiles from lateral thermal gradients within the printed circuit board 144. This cold junction isolation enables the wafer level thermal sensor package 100 to be placed directly on the printed circuit board 144 (e.g., without a flex or other connection means) and minimize or eliminate temperature measurement error due a thermal gradient.

In implementations, the wafer level thermal sensor package 100 illustrated in FIG. 1F can include a cap wafer assembly 124, which can include a lid and/or a hat configuration. In these implementations, the cap wafer assembly 124 may include a silicon and/or a Fe—Ni alloy (e.g., Kovar) hat and/or lid. A lid may include a flat wafer that can be coupled directly with base 152. A hat configuration may include a lid with extensions (as shown ion FIG. 1F) that may directly couple with base 152. The cap wafer assembly 124 can be coupled with base 152 such that it at least partially defines a cavity 146. The cap wafer assembly 124 may be coupled to base 152 using an epoxy or other adhesive.

In one specific embodiment, a wafer level thermal sensor package 100 can include a conjoined first thermopile 154 and second thermopile 156 and an integrated resistance thermopile detector 150 disposed on a silicon substrate 102. In another specific embodiment, a wafer level thermal sensor package 100 can include a conjoined first thermopile 154 and second thermopile 156 and an integrated resistance thermopile detector 150 on a substrate 102 in a pedestal form.

A wafer level thermal sensor package 100 having a cavity 160 serves to thermally isolate the first thermopile 154, second thermopile 156, and resistance temperature detector 150 from the printed circuit board 144 because the cavity 160 functions as a thermal insulator between the base 152 and the cold junctions of the first thermopile 154 and second thermopile 156. In these embodiments that utilize a silicon substrate 102 and/or a cavity 160, thermal gradients between the cold junctions of the first thermopile 154 and/or the second thermopile 156 and the resistance thermopile detector 154 can be significantly reduced and can result in a more accurate temperature measurement.

Example Fabrication Processes

The following discussion describes example techniques for fabricating a wafer level thermal sensor, such as the wafer level thermal sensor package 100 shown in FIGS. 1A through 1D. FIGS. 3A through 3F illustrate a section of a wafer level thermal sensor package 100 during fabrication of an example thermal sensor package 300 (such as the wafer level thermal sensors 100 shown in FIGS. 1A through 1D).

FIG. 3A depicts an example process 200 for fabricating a wafer level thermal sensor package 100 shown in FIGS. 1A through 1D. In one or more implementations, the process 200 may utilize suitable complementary metal-oxide-semiconductor (CMOS) semiconductor processing techniques to fabricate the wafer level thermal sensor package 100 (or thermal sensor package 300).

As shown in FIGS. 3A and 3B, a thermopile stack is formed on a substrate (Block 202). In one or more implementations, forming a thermopile stack 322 on a substrate 302 can include receiving a substrate 302 (e.g., a silicon wafer) and utilizing CMOS processes to form the thermopile stack 322. In some embodiments, forming the thermopile stack 322 and receiving the substrate 302 may include forming a sacrificial layer (e.g., TEOS, silicon dioxide) that is configured to be etched subsequent to forming the thermopile stack 322. For example, deposition processes, such as lithography, physical vapor deposition, physical vapor deposition, and/or etching may be utilized to form the thermopile stack 322 and/or the sacrificial layer as a part of the substrate 302. In one specific example, a dielectric membrane 304 and the first interlayer dielectric 308 and the second interlayer dielectric 312 can be deposited on the substrate 302 using chemical vapor deposition while the first thermoelectric layer 306 and the second thermoelectric layer 310 can be formed using a sputtering process. It is contemplated that multiple deposition processes can be utilized to form the individual layers in the thermopile stack 322. In some additional embodiments, the individual layers in the thermopile stack 322 can be etched (e.g., wet etching, plasma etching, etc.) to form a desired pattern. For example, a first thermoelectric layer 306 and the second thermoelectric layer 310 can be deposited, masked, and etched using a wet etch process (e.g., hydrofluoric acid) to form layers configured to function as a thermocouple and/or thermopile.

Additionally, forming the thermopile stack 322 can include forming a passivation layer 318, a metal connection assembly 314, and a bond pad 316. In some embodiments, forming the passivation layer 318 may include forming an absorption stack 320. Forming the passivation layer 318, a metal connection assembly 314, absorption stack 320, and/or a bond pad 316 can include similar deposition processes as those listed previously. For example, the passivation layer 318 can be deposited using chemical vapor deposition, while the metal connection assembly 314 and the bond pad 316 can be deposited using sputtering and selectively etched. Forming the metal connection assembly 314 can include forming and/or placing metal through-vias, contact pads, and/or a redistribution layer, using deposition and/or selective etching processes. In a specific example, lithography, masking, and selective etching can be used to form the metal connection assembly 314 and the bond pad 316 in order to obtain the desired metal lines and interconnects. As described above, the absorption stack 320 may include multiple metal layers for providing absorption and/or reflective characteristics for thermopile sensing.

Subsequent to forming the passivation layer 318 and the thermopile stack 322, at least one trench and/or hole can be formed in the passivation layer 318 and/or the thermopile stack 322, which is illustrated in FIG. 3C. In an implementation, forming the at least one trench and/or hole can include using lithography and an etch process to selectively etch the passivation layer 318. In one specific embodiment, the hole(s) and/or the trench(es) can be formed in the passivation layer 318 using reactive-ion etching.

As shown in FIGS. 3D and 3E, a cavity 346 can be formed in the substrate 302, which can include etching the substrate 302 and/or a sacrificial layer 301 of the substrate 302. In implementations, isotropic etching, anisotropic etching, or a combination of both is performed on the substrate 302 through the holes and/or trenches formed in the passivation layer 318. The etching process is configured to be selective so that it does not remove the passivation layer 318 and only etches the substrate 302 and/or sacrificial layer 301. In embodiments, the etching process can include a wet process using potassium hydroxide (KOH) and/or tetramethylammonium hydroxide (TMAH). In other embodiments, the etching process can include a dry etching process, such as plasma etching. In yet other embodiments, a combination wet and dry etching process can be used. In one specific example, forming the cavity 346 includes using an etching process to etch a cavity 346 that is from approximately 50 µm to approximately 250 µm in depth. In general, a deeper cavity 346 can result in the wafer level thermal sensor package 100 or thermal sensor package 300 being less sensitive to gas. Exemplary resulting structures are illustrated in FIGS. 3D and 3F. In some embodiments, the various layers formed over the thermopile stack 322 may then be selectively etched to expose at least one bond pad 316.

In some implementations, the substrate 302 may be placed on a stepped structure 362 and/or base 352 forming a cavity 360. In this implementation, the substrate 102 is not etched but includes a first thermopile 354, a second thermopile 356, and/or a resistance temperature detector 350. Additionally, the cavity 360 may be filled with a low-conductivity gas and/or a vacuum. In these implementations, the substrate 302 may be electrically connected to base 352 using vias, wiring, metal traces, and/or a redistribution structure.

Then, a cap wafer assembly is placed on the thermopile stack (Block 204). In implementations, placing the cap wafer assembly 324 on the thermopile stack 322 can include etching a wafer to form a cavity (e.g., using etching, such as KOH, TMAH, and/or deep-ion reactive etching), placing at least one optical filter and/or metal layer on the wafer, and/or forming a metal stack on the wafer configured for coupling the cap wafer assembly 324 to the thermopile stack 322 and/or the passivation layer 318. Placing the cap wafer assembly 324 on the passivation layer 318 and/or the thermopile stack 322 can include using a metal stack 334 and/or a glass frit bonding process to couple the cap wafer assembly 324 to the passivation layer 318 and/or the thermopile stack 322. In a specific example, placing the cap wafer assembly 324 can include placing a cap wafer assembly 324 having a lid and/or hat configuration on the base 354 using an epoxy or other adhesive. In implementations, the bonding process is performed in a vacuum, and the actual bond can be hermetically sealed. The wafer level thermal sensor package 100 gas environment is very controlled and immune to drift, which increases the sensitivity of the wafer level thermal sensor package 100.

In some embodiments, placing the cap wafer assembly 324 can include coupling the wafer level thermal sensor package 100 to another device, such as a printed circuit board 344, using a wire bond configuration (e.g., forming a wire bond 142 that electrically couples the bond pad 316 to a printed circuit board 344) and/or a via configuration (e.g., forming a via 136, via metal 138, and/or a redistribution layer 140 that electrically couples the bond pad 316 to a printed circuit board 144).

Suitable back end processing techniques may be utilized to finalize the thermal sensor package 300 and/or the wafer level thermal sensor package 100. For example, the wafer level thermal sensor package 100 can be singulated from a wafer to form an individual thermal sensor package.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:
1. A wafer level thermal sensor package, comprising: a substrate; a thermopile stack, comprising: a dielectric membrane formed on a first side of the substrate, where the substrate and the dielectric membrane at least partially define a first cavity, the dielectric membrane configured to provide thermal conductance between an absorption stack and the substrate; a first thermoelectric layer formed on the dielectric membrane; a first interlayer dielectric formed on the first thermoelectric layer and the dielectric membrane; a second thermoelectric layer formed on the first interlayer dielectric; a second interlayer dielectric formed on the second thermoelectric layer and the first interlayer dielectric; a metal connection assembly electrically coupled to the first thermoelectric layer and the second thermoelectric layer; a passivation layer disposed on the metal connection assembly and the second interlayer dielectric, wherein the passivation layer comprises the absorption stack, wherein the absorption stack comprises: a first layer comprising a material configured to provide reflective characteristics, a second layer comprising a long wavelength infra-red material and a third layer comprising a absorption material and where the passivation layer includes at least one of a trench or a hole extending from the first cavity to a surface of the passivation layer distal from the substrate; and a bond pad disposed on the passivation layer and electrically coupled to the metal connection assembly, the bond pad configured to provide an electrical connection to an external device; and a cap wafer assembly coupled to the substrate and the thermopile stack, the cap wafer assembly including a wafer having a second cavity formed on a side of the wafer configured to be adjacent to the thermopile stack, the second cavity defining an aperture through which Infrared energy enters the wafer level thermal sensor package.

2. The wafer level thermal sensor in claim 1, where the substrate includes a silicon wafer.

3. The wafer level thermal sensor in claim 1, where the substrate includes a sacrificial layer disposed adjacent to the dielectric membrane.

4. The wafer level thermal sensor in claim 1, where at least one of the first thermoelectric layer or the second thermoelectric layer includes at least one of n-doped silicon, p-doped silicon, or a metal.

5. The wafer level thermal sensor in claim 1, where the first thermoelectric layer and the second thermoelectric layer form a thermopile.

6. The wafer level thermal sensor in claim 1, where the cap wafer assembly includes a metal layer on at least one surface of the wafer.

7. The wafer level thermal sensor in claim 6, where the metal layer includes at least one of aluminum, gold, nickel, tantalum, or titanium.

8. The wafer level thermal sensor in claim 1, where the cap wafer assembly includes an optical filter on at least one surface of the wafer.

9. The wafer level thermal sensor in claim 8, where the optical filter includes at least one of germanium, silicon, zinc sulfide, zinc selenide, or yttrium fluoride.

10. The wafer level thermal sensor in claim 1, where the cap wafer assembly includes a silicon wafer.

11. The wafer level thermal sensor in claim 1, where the cap wafer assembly includes a metal stack configured to bond the cap wafer assembly to the thermopile stack.

12. The wafer level thermal sensor in claim 1, where the cap wafer assembly includes a lens.

13. The wafer level thermal sensor in claim 1, further including a second cap wafer coupled to the thermopile stack and the substrate, where the second cap wafer is coupled to a side of the substrate that is distal from the thermopile stack.

14. The wafer level thermal sensor in claim 1, further including a printed circuit board coupled to the wafer level thermal sensor.

15. A process for fabricating a wafer level thermal sensor, comprising: forming a thermopile stack on a substrate, comprising: receiving a substrate; depositing a dielectric membrane on a first side of the substrate, where the substrate and the dielectric membrane at least partially define a first cavity using chemical vapor deposition method, the dielectric membrane configured to provide thermal conductance between an absorption stack and the substrate; forming a first thermoelectric layer on the dielectric membrane using a sputtering process; forming a first interlayer dielectric on the first thermoelectric layer and the dielectric membrane using chemical vapor deposition method; forming a second thermoelectric layer on the first interlayer dielectric using a sputtering process; forming a second interlayer dielectric on the second thermoelectric layer and the first interlayer dielectric using a chemical vapor deposition method; forming a metal connection assembly electrically coupled to the first thermoelectric layer and the second thermoelectric layer; forming a passivation layer disposed on the metal connection assembly and the second interlayer dielectric, wherein the passivation layer comprises an absorption stack, wherein the absorption stack comprises: a first layer comprising a material configured to provide reflective characteristics, a second layer comprising a long wavelength infra-red material and a third layer comprising a absorption material and where the passivation layer includes at least one of a trench or a hole extending from the first cavity to a surface of the passivation layer distal from the substrate; and forming a bond pad disposed on the passivation layer and electrically coupled to the metal connection assembly, the bond pad configured to provide an electrical connection to an external device; and placing a cap wafer on the thermopile stack, where the cap wafer assembly and the thermopile stack at least partially define a second cavity, the second cavity defining an aperture through which Infrared energy enters the wafer level thermal sensor package.

16. The process for fabricating a wafer level thermal sensor in claim 15, where the wafer level thermal sensor includes a through-silicon via.

17. The process for fabricating a wafer level thermal sensor in claim 15, further comprising:
   placing a second cap wafer on a side of the substrate distal from the thermopile stack.

* * * * *